United States Patent
Monkowski et al.

(10) Patent No.: US 7,695,984 B1
(45) Date of Patent: Apr. 13, 2010

(54) USE OF MODELED PARAMETERS FOR REAL-TIME SEMICONDUCTOR PROCESS METROLOGY APPLIED TO SEMICONDUCTOR PROCESSES

(75) Inventors: Joseph R Monkowski, Danville, CA (US); Barton Lane, Pleasanton, CA (US)

(73) Assignee: Pivotal Systems Corporation, Pleasanton, CA (US)

( * ) Notice: Subject to any disclaimer, the term of this patent is extended or adjusted under 35 U.S.C. 154(b) by 781 days.

(21) Appl. No.: 11/409,308

(22) Filed: Apr. 20, 2006

Related U.S. Application Data (60) Provisional application No. 60/673,663, filed on Apr. 20, 2005.

(51) Int. Cl.
*H01L 21/00* (2006.01)
(52) U.S. Cl. .................. 438/5; 438/9; 438/10; 438/14; 257/E21.528
(58) Field of Classification Search .................... 438/14, 438/9, 5, 10, 11, 7; 257/E21.521, E21.525, 257/E21.528
See application file for complete search history.

(56) References Cited

U.S. PATENT DOCUMENTS

| | | | |
|---|---|---|---|
| 5,576,629 A | 11/1996 | Turner et al. | |
| 5,653,894 A | 8/1997 | Ibbotson et al. | |
| 5,753,066 A * | 5/1998 | Kubota et al. | 156/345.44 |
| 5,925,212 A * | 7/1999 | Rice et al. | 156/345.27 |
| 5,989,928 A * | 11/1999 | Nakata et al. | 438/7 |
| 6,238,937 B1 | 5/2001 | Toprac et al. | |
| 6,447,691 B1 * | 9/2002 | Denda et al. | 216/61 |
| 6,582,618 B1 | 6/2003 | Toprac et al. | |
| 6,677,246 B2 * | 1/2004 | Scanlan et al. | 438/723 |
| 6,764,575 B1 | 7/2004 | Yamasaki et al. | |
| 6,797,640 B2 * | 9/2004 | Tesauro et al. | 438/717 |
| 6,830,939 B2 | 12/2004 | Harvey et al. | |
| 2003/0199108 A1 * | 10/2003 | Tanaka et al. | 438/14 |
| 2005/0151544 A1 * | 7/2005 | Mahoney et al. | 324/655 |

* cited by examiner

*Primary Examiner*—Victor A Mandala
*Assistant Examiner*—Scott Stowe
(74) *Attorney, Agent, or Firm*—Townsend and Townsend and Crew LLP (57) ABSTRACT

Method and system for detecting endpoint for a plasma etch process are provided. In accordance with one embodiment, the method provides a semiconductor substrate having a film to be processed thereon. The film is processed in a plasma environment during a time period to provide for device structures. Information associated with the plasma process is collected. The information is characterized by a first signal intensity. Information on a change in the first signal intensity is extracted. The change in the first signal intensity has a second signal intensity. The change in signal intensity at the second signal intensity is associated to an endpoint of processing the film in the plasma environment. The second signal intensity may be about 0.25% and less of the first signal intensity.

22 Claims, 9 Drawing Sheets

Via 90nm/0.5% Exposed Area

Contact
90nm/0.5%
Exposed Area

USE OF MODELED PARAMETERS FOR REAL-TIME SEMICONDUCTOR PROCESS METROLOGY APPLIED TO SEMICONDUCTOR PROCESSES

CROSS-REFERENCES TO RELATED APPLICATIONS

This application claims priority to Provisional Application No. 60/673,663 filed on Apr. 20, 2005, commonly assigned, and incorporated by reference herein for all purposes.

BACKGROUND OF THE INVENTION

Embodiments in accordance with the present invention are directed to integrated circuits and their processing for the manufacture of semiconductor devices. More particularly, embodiments in accordance with the present invention provide a method and a system for endpoint detection in an etch process. But it would be recognized that embodiments in accordance with the present invention have a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

As merely an example, etching processes are often used to remove or partially remove a layer to form structures there from. Etching is often performed by an etching tool, such as a dry etcher or wet etcher. The wet etcher often includes a vessel that has an etchant chemical to selectively remove one material from another material. The dry etcher often includes a plasma source and treatment chamber. The dry etcher often uses gases such as fluorine bearing species and chlorine bearing species to remove semiconductor materials such as silicon, or metal such as aluminum, or dielectric material such as silicon oxide. Much work has been done to use real-time metrology to characterize semiconductor manufacturing processes and the effect of these processes on the wafers being processed. One of the big difficulties is that in contrast to ex situ metrology, which allows detailed scrutiny of the wafer surface, real-time metrology requires in situ measurement, which rarely allows such a close investigation of the wafer. Consequently, one needs to measure parameters such as the power being delivered into a process chamber, or the effluent emanating from a process chamber in order to make inferences about the state of the wafer.

Typical objectives of real-time metrology for semiconductor processes include identification of a particular wafer state, such as that point at which a particular thin film is fully etched in a plasma etch process (the end point0; or characterization of key process parameters, such as the rate at which a thin film is being deposited or etched.

One of the primary difficulties in such metrology is the correlation between the measurement and the desired objective. Changes in the measured parameter, such as effluent composition, or the voltage associated with the power being delivered into the process chamber, depend on a myriad different process, chamber, and/or wafer parameters. For example, the amount of effluent being measured depends on whether or not one has completely etched though a particular film, but it will also depend on the temperature of the wafer, the rate at which gases are flowing into the chamber, the power being delivered, and many other parameters.

Currently, this problem is being addressed by running the process under different conditions, either with a design of experiments or with the natural variations that occur in a manufacturing environment, and using techniques such as neural network analysis to find those correlations between the measured parameters and the desired objective such that one can depend on the correlation across a variety of process conditions. Unfortunately, such an approach is not highly robust.

Other conventional techniques such as optical emission spectroscopy (OES) or radio frequency (RF) measurement are also used to determine when a target layer is completely removed or endpoint of the etch process. However as device shrinks, the area of the material removed is a very small fraction of the overall area. In a typical via etch, for example, the area of dielectric layer to be removed is only about 1% or less of the total area. Since OES or RF measurements measure an overall plasma state, the effect from other interferences often overwhelms the signal of the measurement. In addition, conventional endpoint detection relies on mathematic techniques such as multivariate analysis or neural networks to identify the endpoint signal. In absence of physical understanding of factors affecting the signal of measurement, the problem of looking at a wrong signal is further exacerbated. This leads to an over etch or an under etch of the material and impact device performance.

From the above, it is seen that an improved technique for processing semiconductor devices is desired

BRIEF SUMMARY OF THE INVENTION

According to embodiments in accordance with the present invention, techniques for processing semiconductor devices are provided. More particularly, embodiments in accordance with the present invention provides a method for processing a semiconductor device using an end-point detection process. Merely by way of example, embodiments of the present invention can be applied to a plasma etch process for device fabrication, but it would be recognized that embodiments of present invention have a much broader range of applicability.

In a specific embodiment, the method provides a method for processing semiconductor devices. The method includes providing a semiconductor wafer having a film to be processed. The method includes processing the film in a plasma environment during a determined time period and collecting information associated with the plasma environment during the determined time period. The information being characterized by a first signal intensity. The method includes extracting a change in signal intensity from the first signal intensity, the change in signal intensity having a second signal intensity. The method associates the change in signal intensity at the second intensity with an end point associated with the processing of the film in the plasma environment. In a specific embodiment, the second signal intensity is about 0.25% or less of the first signal intensity.

In a specific embodiment, the present invention provides a system for processing semiconductor devices. The system provides an in-situ monitoring for processing one or more films of materials using an end-point detection process. The system includes a chamber, the chamber being adapted to maintain a plasma environment therein. The system also includes a susceptor coupled to the chamber, the susceptor is adapted to hold a semiconductor wafer having a film to be processed. The system includes one or more sensor devices operably coupled to the chamber. The one or more sensors are adapted to collect information associated with the plasma environment during a determined time period. The information is characterized by a first signal intensity. The system includes a process module coupled to the one or more sensors. The process module is adapted to extract a change in signal intensity from the first signal intensity. The change in signal intensity has a second signal intensity. The process module is also adapted to associate the change in signal intensity at the second intensity with an end point associated with the processing of the film in the plasma environment. The second signal intensity is about 0.25% or less of the first signal intensity.

Many benefits may be achieved by way of embodiments of the present invention over conventional techniques. For example, certain embodiments provide technique for an easy to use process that relies upon conventional technology. In some embodiments, the method provides higher device yields in dies per wafer. Additionally, embodiments in accordance with the present invention may provide a process that is compatible with conventional process technology without substantial modifications to conventional equipment and processes. Certain embodiments of the present invention may provide a way to process devices in an plasma ambient, which can result in a more efficient process and a better controlled process. One or more embodiments in accordance with the present invention can be applied to a variety of applications such as memory, ASIC, microprocessor, flat panel display, MEMS, and other devices.

Various additional objects, features and advantages of the embodiments of the present invention can be more fully appreciated with reference to the detailed description and accompanying drawings that follow.

DETAILED DESCRIPTION OF THE INVENTION

According to embodiments of the present invention, techniques for the manufacture of semiconductor devices are provided. More particularly, certain embodiments in accordance with the present invention provide a method and a system for end point detection for an etch process in a plasma environment. Embodiments of the present invention may be applied to the manufacture of advanced integrated circuits such as dynamic random access memory devices, static random access memory devices (SRAM), application specific integrated circuit devices (ASIC), microprocessors and microcontrollers, Flash memory devices, flat panel displays, MEMS, and others.

According to a specific embodiment of the present invention, instead of using a purely mathematical approach that is blind to the actual process being measured, both the effects of the wafer (and/or process and/or chamber) condition that one is trying to identify as well as the effects of the many other parameters, are modeled based upon physical characteristics. Examples of such physical characteristics include, but are not limited to, phenomena detected by a sensor, and correlation of behavior with a mathematical function. Based upon these modeled physical characteristics, a signal from the process may be measured and correlated to the appropriate combination of the equations describing the individual effects. Based upon these physical characteristics and the modeling, a second signal may be extracted from a first signal, the second signal providing indicia of endpoint of the process.

According to an embodiment of the present invention, a method for processing semiconductor wafer is provided. The method includes providing a semiconductor wafer undergoing a process associated with semiconductor device manufacturing. A measurement of one or more parameters associated with this manufacturing process ($P_{measured}$) is provided. One or more parameters associated with the wafer, the process, or the chamber in which the wafer is being processed, which affects the parameters being measured, but cannot be measured directly, whose value(s) is (are) desired are also provided ($P_{interest}$). The method provides a description of the measured parameter(s) with a mathematical model that is a combination of the effects of various parameters, where the latter includes those parameters whose value(s) is (are) desired (Parameterized Process Model). The method provides a determination of the desired parameter(s) by fitting the overall mathematical model to the measured parameter(s), and breaking down the fitted model back into its individual components (Fitting Algorithm).

According to an alternative embodiment of the present invention, a method for processing semiconductor wafers is provided. The method provides a semiconductor wafer undergoing a process associated with semiconductor device manufacturing. The method also provides a measurement of one or more parameters associated with this manufacturing process ($P_{measured}$). The method includes providing one or more parameters associated with the wafer, the process, or the chamber in which the wafer is being processed, whose value(s) is (are) desired, but not being measured directly ($P_{interest}$). The method includes providing a determination of the physical parameters that substantively influence the measured parameter(s) ($P_{other}$). The method includes providing a determination of a mathematical model for each of those substantive physical parameters relating them to the measured parameters (Parameterized Process Model). The method provides a determination of the desired parameter(s) by subtraction of the effects of the substantive parameters(s) using their respective mathematical models:

$$P_{measured}=F\{P_{other}\}+F\{P_{interest}\}, \text{ so}$$

$$P_{interest}=F\{P_{other}-P_{measured}\}$$

where F{A} indicates a function of the set of parameters A

In a specific embodiment, these are manifested as
  Pother=Temp, Pressure, Magnetic Field
  $P_{measured}$=RF Signals (V, I, Phase angle and their harmonics)
  $P_{interest}$=Etch End Point.

The above provides a general description of a use of modeled physical parameters for a real-time measurement of a semiconductor process according to embodiments of the present invention. Further details of the present invention will be described more fully throughout the specification and with reference to the examples below.

A method of processing semiconductor devices according to an embodiment of the present invention can be summarized as follow:

1. Provide a semiconductor wafer having a film to be processed;
2. Provide a plasma environment;
3. Process the film in the plasma environment during a determined time period;
4. Collect information associated with the plasma environment during the determined time period, the information being characterized by a first signal intensity;
5. Extract a change in signal intensity from the first signal intensity, the change in signal intensity having a second signal intensity; and
6. Associate the change in signal intensity at the second intensity with an end point associated with the processing of the film in the plasma environment, the second signal intensity can be about 0.25% or less of the first signal intensity, The above sequence of steps provides a method for endpoint detection for processing a film in a plasma environment for fabricating semiconductor devices according to an embodiment of the present invention. As shown, such steps include collecting and extracting signal intensity information associated with the plasma environment during a determined time period. The signal intensity information is used in determining an endpoint of the plasma process in a specific embodiment. The method provides an accurate and reliable determination of the endpoint for the plasma etc process. Further details of embodiments of the present invention can be found throughout the present specification and more particularly according to the figures described below.

Figure 1:
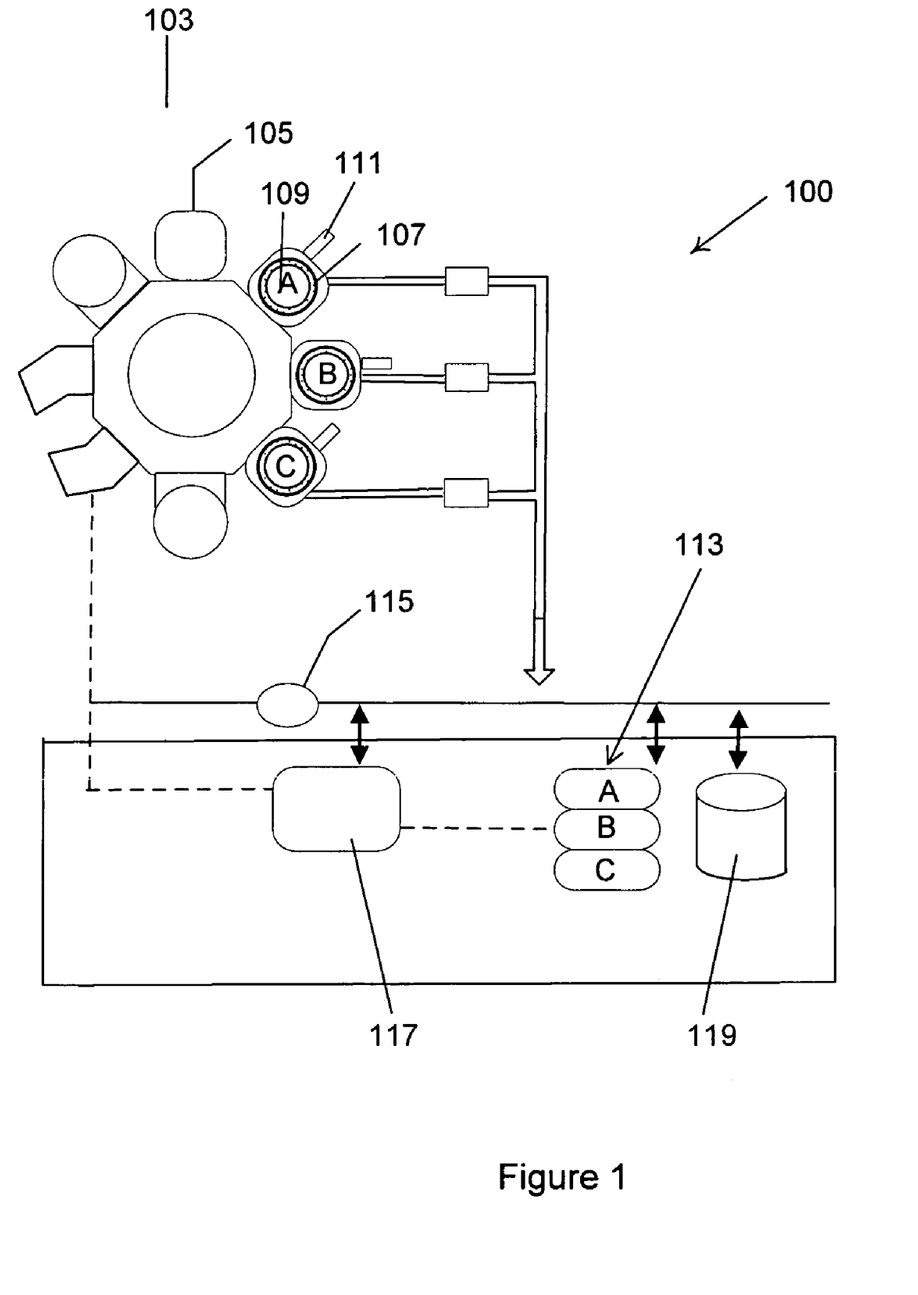
FIG. 1 is a simplified diagram of a system for processing semiconductor devices according to an embodiment of the present invention.

FIG. 1 is a simplified diagram illustrating a system 100 for processing semiconductor devices according to an embodiment of the present invention. The diagram is merely an illustration, which should not unduly limit the scope of the claims herein. One of ordinary skill in the art would recognize many other variations, modifications, and alternatives. As shown, the system includes a process tool 103. As merely an example, the process tool can include a dry etch tool using a plasma environment such as those manufactured by Tokyo Electric Limited of Tokyo, Japan, but can be others. Multiple process chambers 105 are coupled to the process tool. Each of the process chambers include elements such as permanent magnets, an RF power supply and matching network to provide a plasma environment for an etching process, but can be others.

Each of the process chambers also includes a susceptor 107 to hold a semiconductor wafer 109 to be processed. The susceptor can be an electrostatic chuck or a vacuum chuck among others. The semiconductor wafer has a film, such as a dielectric film, deposited thereon. The dielectric film can be silicon oxide, silicon nitride, silicon oxynitride or a combination.

Each of the chambers also includes one or more sensor devices 111 operably coupled to the chamber, also shown in FIG. 1. The one or more sensors can include a RF sensor, an optical sensor, a mass spectrometer, or a temperature probe among others. The one or more sensors are configured to collect information associated with the plasma environment in the etch tool during a determined time period. The chamber maintains the plasma environment during the determined time period. The information is characterized by a first signal intensity. In certain embodiments, the sensor device is configured to collect information on the RF signal in the chamber, but can be others. These other information includes certain light intensity, temperature, pressure, or gas composition, among others.

The system also includes a process module 113 coupled to the sensor device in each of the process chambers. The process module includes elements such as a computer device and computer codes to extract information on the change in signal intensity from the first signal intensity, for example, RF signal intensity. The change in signal intensity has a second signal. The second signal is associated with an endpoint of the film processed in the plasma environment. In a specific embodiment, the second signal intensity is characterized by a magnitude of about 0.25% or less of the first signal intensity. In an alternative embodiment, the second signal intensity is characterized by a magnitude of about 0.1% to 0.25% of the first signal intensity. Preferably, the second signal intensity is characterized by a magnitude of about 0.01% to 0.1% of the first signal intensity. In a specific embodiment, the process module is configured to remove interfering signals associating with the etching process. The interfering signal may include those from thermal information, outgassing, magnetic interference, polymeric materials, among others.

As shown in FIG. 1, the system further includes a network interface 115 to connect the process module to a database or a data storage 119. The network interface may include communication standards such as a semiconductor equipment control system (SECS/GEM or SECS II/GEM or HSMS). The database can be part of the fabrication facility network and connect to other tools or computers. As shown, the signal intensity information, including the first signal intensity and the second signal intensity for each of the process chambers is uploaded to the database using the network interface.

Figure 2:
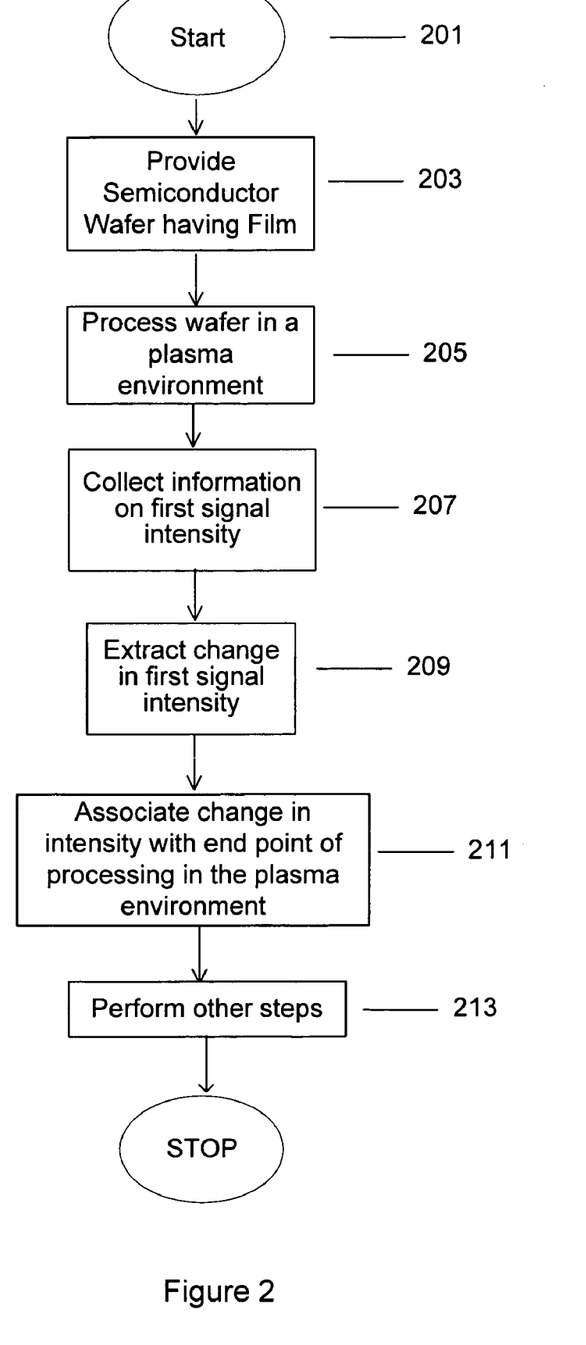
FIG. 2 is a simplified flow diagram for processing semiconductor devices according to an embodiments of the present invention.

FIG. 2 is a simplified flow diagram of a method for processing a semiconductor device according to an embodiment of the present invention. As shown, the method includes a start Step 201. The method includes providing a semiconductor wafer having a film thereon (Step 203). The method also includes processing (Step 205) the semiconductor wafer including the film in a plasma environment for a determined time period. The method includes collecting a first signal intensity (Step 207) associated with the plasma environment in the determined time period.

The method then extracts a change in signal intensity from the first signal intensity (Step 209). This extraction may be based upon physical characteristics of the process. For example, in accordance with one embodiment, a signal from a plasma etching process may be extracted based upon results of a physical model of the etching process determined from a Hall probe positioned outside the plasma processing chamber to measure electromagnetic fields. In accordance with an other embodiment of the present invention, a signal from a plasma etching process may be extracted based upon a physical model of the etching process determined from correlation of temperature with an approximately exponential mathematical function. Of course, there can be other variations, modifications, and alternatives.

The method associates (Step 211) the change in signal intensity from the first signal with an endpoint of the processing the film in the plasma environment during the time period. The method continues (Step 213) to perform other process steps.

The above sequence of steps provides a method for determining an endpoint for processing a film in a plasma environment for fabricating semiconductor devices according to an embodiment of the present invention. As shown, such steps include collecting and extracting a change in signal intensity information associated with the plasma environment during a determined time period. The change in signal intensity information is used in determining an endpoint of the plasma process in a specific embodiment. In a specific embodiment, the change in signal intensity information is about 0.25% or less of the first signal intensity. In a specific embodiment, the change in signal intensity information can be about 0.05-0.1% of the first signal intensity. In a specific embodiment, the change in signal intensity information can be about 0.1-0.25% of the first signal intensity. Of course there can be other variations, modifications, and alternatives. Methods in accordance with embodiments of the present invention provide an accurate and reliable determination of the endpoint for an plasma etch process. Further details of embodiments of the present invention can be found throughout the present specification.

Figure 3:
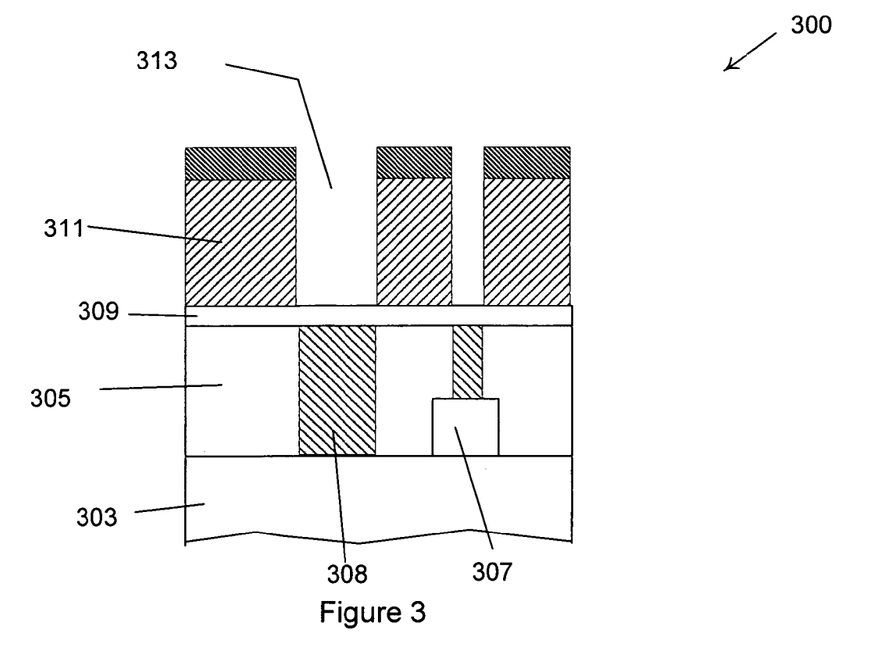
FIGS. 3-3A are simplified diagrams illustrating a method for endpoint detection for an etch process according to an embodiment of the present invention.
Figure 4:
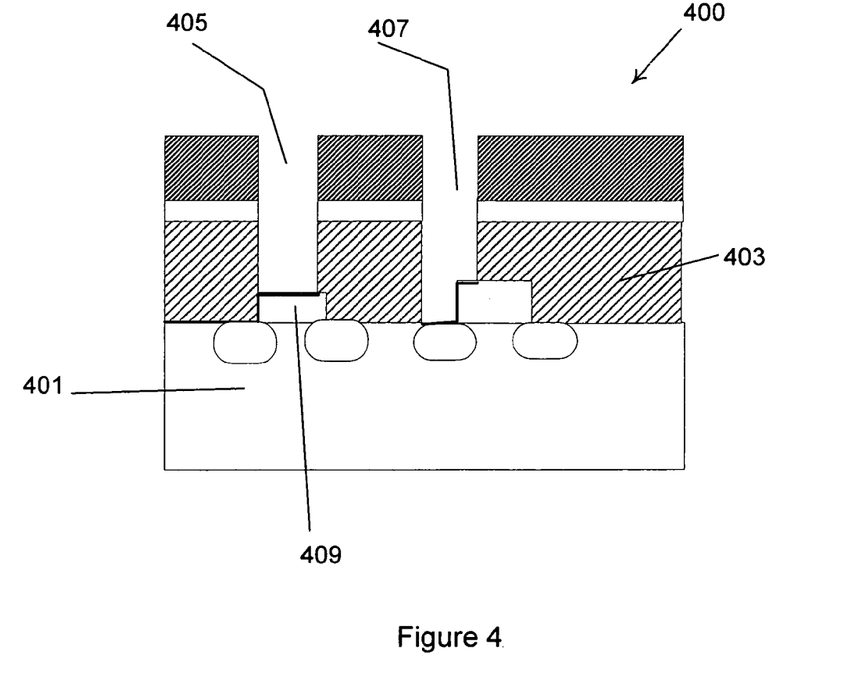
FIGS. 4-4A are simplified diagrams illustrating a method for endpoint detection for an etch process according to an embodiment of the present invention.

FIGS. 3-4 are a simplified diagrams exemplifying a method for device fabrication according to an embodiment of the present invention. As shown in FIG. 3, a method for fabrication of a damascene via structure is provided. A semiconductor device 300 is provided. Semiconductor device 300 includes a semiconductor substrate 303. The semiconductor substrate can be a single crystal silicon, silicon on insulator (SOI), a silicon-germanium wafer or the like. The semiconductor device also includes a first dielectric layer 305. The first dielectric layer may include such dielectric materials as silicon oxide, silicon nitride, silicon oxynitride or a combination. Embedded in the first dielectric layer are structures such as a polysilicon gate 307, as well as conductor 308 among others. The conductor layer may comprises materials such as copper, tungsten, or aluminum. In a specific embodiment, the conductor comprises copper.

Also shown in FIG. 3, a second dielectric layer 311 is formed overlying an etch stop layer 309. The stop layer comprises material having a different etch characteristic, e.g., etch rate or etch selectivity, from the second dielectric layer. The stop layer can be formed using materials which has a different etch characteristic (e.g., etch selectivity or etch rate) from the second dielectric layer. For example, a silicon nitride can be used as a stop layer for the etching of a silicon oxide. Portions of the second dielectric layer 313 are removed to provide for a damascene via structure. In a specific embodiment, the portions of the dielectric layer are about 1% of a total dielectric material in dielectric layer 311. The portions of the second dielectric layer are removed using a dry etch process in a plasma environment. Of course there can be other variations, modifications, and alternatives.

According to an embodiment of the present invention, a method to determine an end point for the etching of via structures 311 is provided. A sensor device is used to measure a first signal intensity of the plasma environment. The sensor device is configured to collect RF information of the plasma environment in a specific embodiment. The first signal intensity can include a voltage, an impedance, a current or associated phase angle between voltage and current or a combination thereof. The first signal intensity measured depends on the application.

In a preferred embodiment, the first signal intensity includes a total voltage, a total impedance, or a total current, of the plasma environment, among others. The method includes extracting a change in a signal intensity from the first signal intensity. As indicated above, this extraction can be based upon a physical model of the process being performed, for example as determined from a known correlation of a parameter with a mathematical function.

The change in the signal intensity has a second signal intensity and occurs in a second time period. The second signal intensity is associated with a complete etching of the dielectric material or the endpoint for the etching of the dielectric material for the via structures. In a specific embodiment, the second signal intensity is less than about 0.25% of the first signal intensity. In a specific embodiment, the second signal intensity is about 0.05-0.1% the first signal intensity. In a specific embodiment, the second signal intensity is about 0.1-0.25% the first signal intensity. Of course there can be other variations, modifications, and alternatives.

Figure 3A:
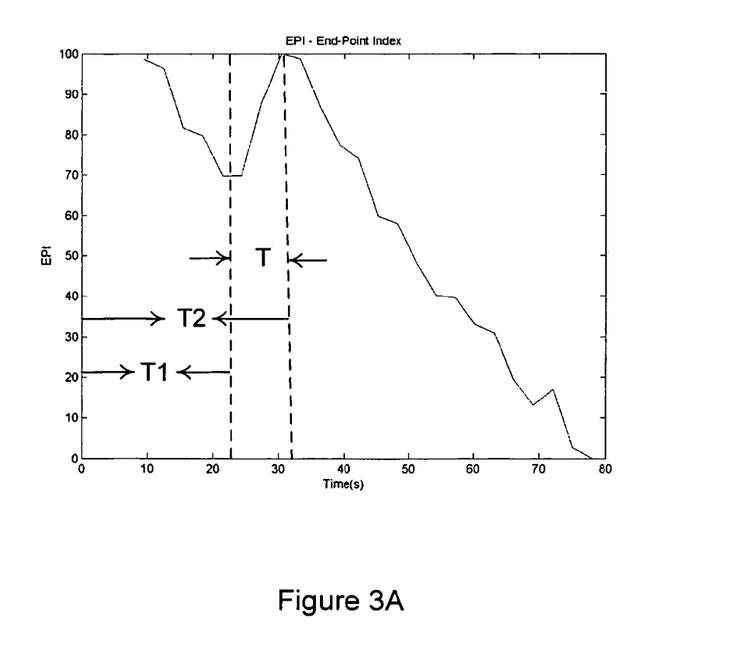

As shown in FIG. 3A, an exemplified plot of an endpoint index as a function of time is for the dielectric etch for a via structure is illustrated. The endpoint index is shown on the vertical axis and time is shown on the horizontal axis. The end point index is derived from RF signal information such as a total voltage, a total current, or a total impedance of the plasma environment, but there can be others. As shown, the endpoint index changes from a value of about 70 to a value of about 100, occurring in the time interval T, between T1 and T2. The endpoint of the etch process occurs at time T2. Of course, one skilled in the art would recognize many other variations, modifications, and alternatives.

FIG. 4 is a simplified diagram exemplifying a method for device fabrication according to an embodiment of the present invention. As shown in FIG. 4, a method for fabricating a contact via structure is provided. As shown, a semiconductor device 400 is provided. Semiconductor device 400 includes a semiconductor substrate 401. The semiconductor substrate can be a single crystal silicon, silicon on insulator (SOI), a silicon-germanium wafer or the like. The semiconductor device also includes a dielectric layer 403. The dielectric layer may include such dielectric materials as silicon oxide, silicon nitride, silicon oxynitride or a combination. In a specific embodiment, portions of the dielectric layer 405, 407 are removed to provide for a contact structure. In a specific preferred embodiment, the portions of the dielectric layer is about 1% or less of a total dielectric material in dielectric layer 403. The portions of the dielectric layer are removed using a dry etch process in a plasma environment in a specific embodiment. A stop layer, 409 may also form overlying the semiconductor substrate. The stop layer can be formed using materials which has a different etch characteristic (e.g., etch selectivity) from the dielectric layer. For example, a silicon nitride can be used as a stop layer for the etching of a silicon oxide. Of course, there can be other variations, modifications, and alternatives.

According to an embodiment of the present invention, a method to determine an end point for the etching of contact via structures 400 is provided. A sensor device (as shown in FIG. 1) is used to collect information of the plasma environment. The sensor device is configured to collect RF information of the plasma environment in a specific embodiment. The information can include a voltage, an impedance, a current or associated phase angle of the RF power of the plasma environment or a combination. The information collected depends on the application. In certain embodiments, the first signal intensity is associated with a total voltage, or a total current, or a total impedance, or a combination thereof, of the RF environment but can be others. The method also performs an extraction of a change in a signal intensity from the first signal intensity. The extraction of the change in the signal intensity may include removing interfering signals associated with outgassing, thermal information, polymer materials, or magnetic fields, but can be others. The change in the signal intensity has a second signal intensity. The second signal intensity is associated with the endpoint for the etching of the dielectric material for the contact structures. In a specific embodiment, the second signal intensity is about 0.25% or less of the first signal intensity. In an alternative embodiment, the second signal is about 0.05%-0.1% of the first signal intensity. Preferably, the second signal is about 0.1%-0.25% of the first signal intensity. Of course, one skilled in the art would recognize many other variations, modifications, and alternatives.

Figure 4A:
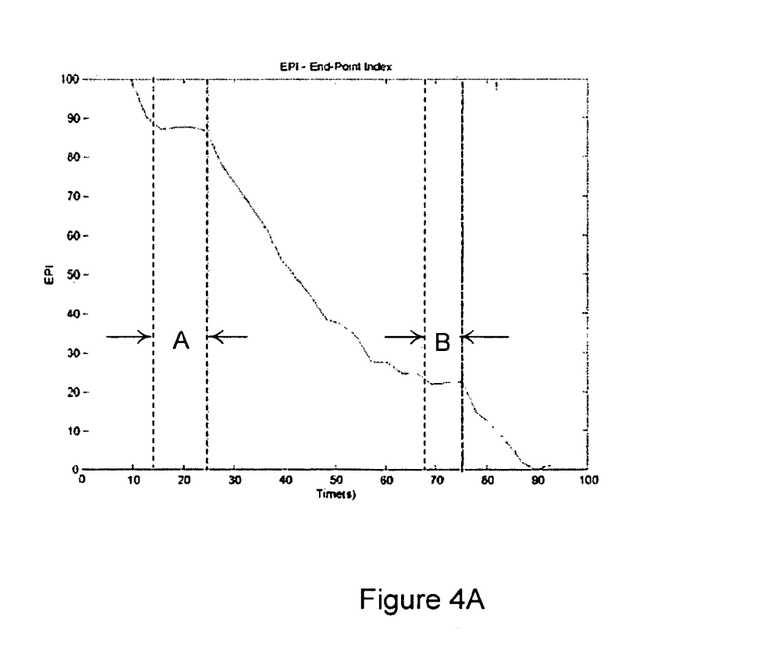

FIG. 4A is a simplified plot showing an end point index as a function of time for the dielectric etch for the contact structure illustrated in FIG. 4. As shown, the endpoint index is shown on the vertical axis and the time is shown on the horizontal axis. The endpoint index is derived from RF signal information such as voltage, current, or impedance of the plasma environment in the process chamber, but can be others. In a specific embodiment, the end point index is derived from a total voltage, a total current or a total impedance of the plasma environment. As shown, the change in end point index during time A is associated with the endpoint of etching contact structure 405 and the change in signal intensity during time B is associated with the endpoint of etching contact structure 407 respectively. Of course, on skilled in the art would recognize many other variations, modifications, and alternatives.

EXAMPLES

For illustration, experiments are performed to exemplify embodiments of the present invention, which are given below:

Example 1

The first experiment is performed on a Dipole Ring Magnet (DRM) magnetron plasma etch process apparatus, for example, manufactured by Tokyo Electronic Limited of Tokyo, Japan. Such a system is commonly used in dielectric thin film etch for insulators in semiconductor devices but can be others. The apparatus includes a ring of permanent magnets rotating around the process chamber to provide a rotating magnetic field and a high plasma intensity to enhance etch performance of the system.

The end point detection for a dielectric etch, for example, depends primarily on the etch reaction. During the time interval of the dielectric film being etched, a steady state is established. The steady state is a result of the etch process and chemical species such as ions from the plasma and etched species from the dielectric film. The steady state is maintained until the dielectric film is completely removed in the etch process. Preferably, when the dielectric film is completely removed, the etch reaction should cease. A change in the steady state is manifested in a change in plasma signal measurement.

Figure 5:
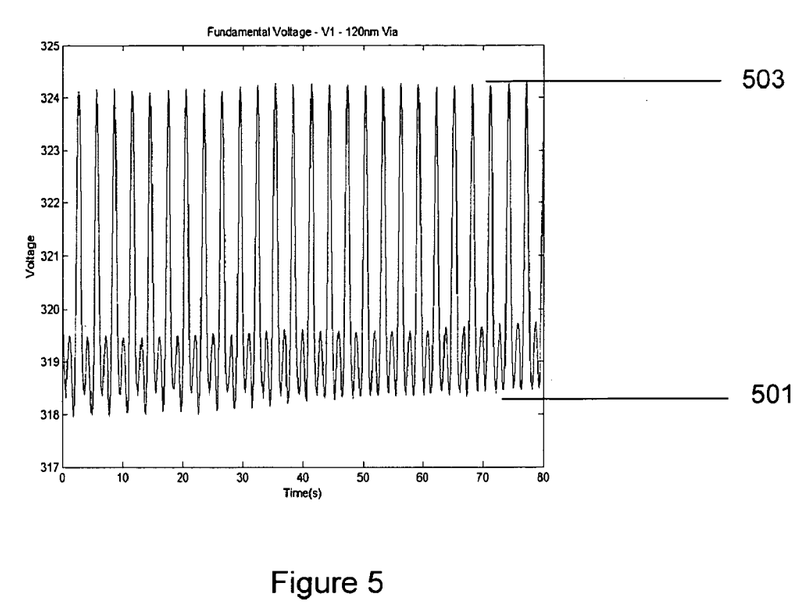
FIGS. 5-6 are simplified diagram exemplifying a method of endpoint detection for an etch process according to an embodiment of the present invention.

The primary measurements for determining endpoint of an etch process for such a system may include voltage, current, phase and/or impedance measured by an RF sensor, as well as optical emission intensities from an OES sensor. As show in FIG. 5, a plot of voltage as a function of time during a dielectric etch process on a DRM tool is provided. The dielectric film has an approximate 1% exposed area. As shown, the voltage varies between approximately value 501 and value 503 in a periodic manner. In this original form, it would be impossible to determine the effects of changes in the etch reaction and an etch endpoint. A conventional approach to remove such interfering signal is using a filter to eliminate the periodic variation. However, the magnetic field strength in each of the chamber has a component that cannot be described by a periodic variation and therefore cannot be removed by such an approach. In addition, other conventional approaches such as multivariate analysis or neural network would not be effective with this signal.

Moreover, in a multi-DRM chamber setup, the magnetic field in a chamber is a also affected by the rotating magnets from nearby chambers. The plasma within in each of the process chamber is affected accordingly.

Figure 6:
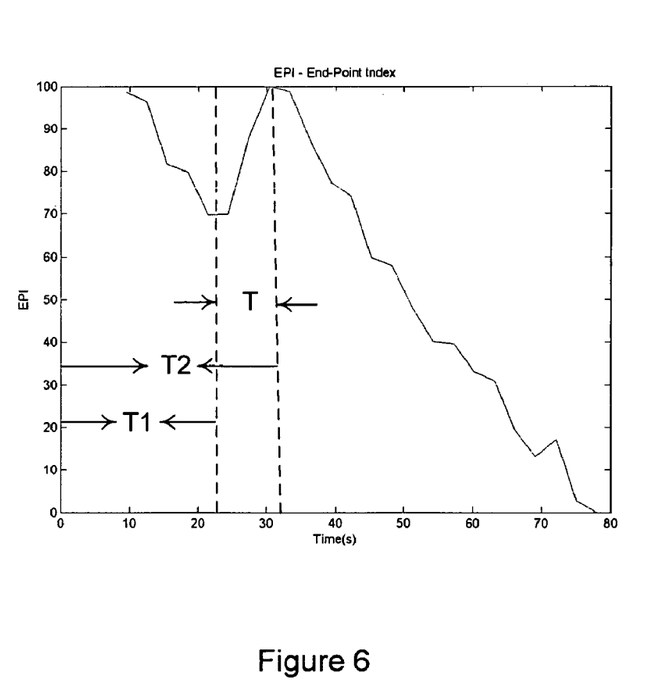

In an embodiment of the present invention, to provide a physical model for the resulting magnetic field in a process chamber, a Hall probe is placed just outside the process chamber wall in the plane of the wafer. The strength of magnetic field inside each process chamber is calculated, taking into consideration that the magnetic field strength decreases as the square of the distance, and that the addition of the magnetic field strengths is an addition of vectors. Once the effect of the magnetic field is determined, this effect can be subtracted from the waveform of FIG. 5. The resulting waveform is shown in FIG. 6.

Without being bound by any particular theory, it can be shown that when an end point is reached and the etch reaction stops, the electronegativity of plasma changes, resulting in a change in voltage and impedance, among others. Such a change will happen in a time period, typically of a few seconds, until the last traces of the film are completely removed from the surface of the wafer. As a result, the voltage and impedance will take on new values once the etch stops. Such a behavior is illustrated in the plot on FIG. 6 in the time period ranging from T1 to T2. It is determined that the etching is completed at approximately time T2 or this is the end point of the etch process. Of course that can be other variations, modifications, and alternatives.

Example 2

For this experiment, the etching was carried out in a Rainbow 4528 plasma etch system, manufactured by Lam Research Corporation of Fremont, Calif. This is another plasma etch system that is commonly used for dielectric thin film etching in semiconductor device manufacturing.

Figure 7:
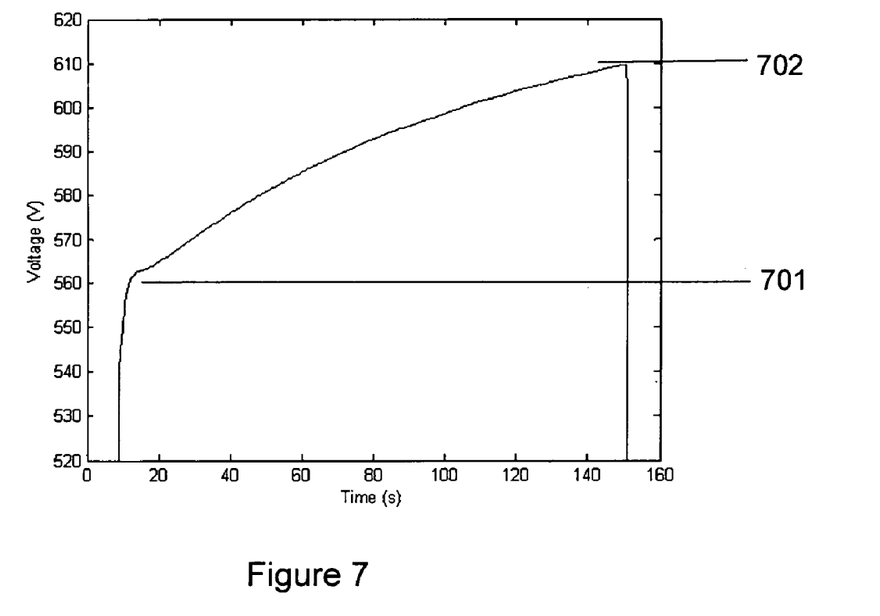
FIGS. 7 and 7A are simplified diagrams illustrating an example of a method for endpoint detection for an etch process according to an embodiment of the present invention.

As in the first example, the primary measurements for determining endpoint of an etch process for such a system are the voltage, current, phase, and/or impedance measured by an RF sensor, as well as optical emission intensities measured by an OES sensor. As shown in FIG. 7, a plot of voltage as a function of time during a dielectric etch process on a Rainbow 4528 plasma etch process tool is provided. As shown, the voltage starts at 701 and rises smoothly to 702. In this original form, it would be extremely difficult to determine the effects of changes in the etch reaction resulting from the etch endpoint. In fact, one possible conclusion is that there is no apparent signal associated with the endpoint.

One observation made regarding the Rainbow 4528 process chamber is that the plasma is influenced by thermal effects, where the primary effect is that of the wafer being heated during the etch process by the ions impinging on the wafer from the plasma. This increase in temperature, which has been found to follow an approximately exponential mathematical function, produces a corresponding change in the plasma and the measured RF parameters. Since changes in the etch reaction produce a signal much smaller than the signal resulting from the temperature change, the effect of the temperature change needs to be removed in order to be able to detect the endpoint signal.

Figure 7A:
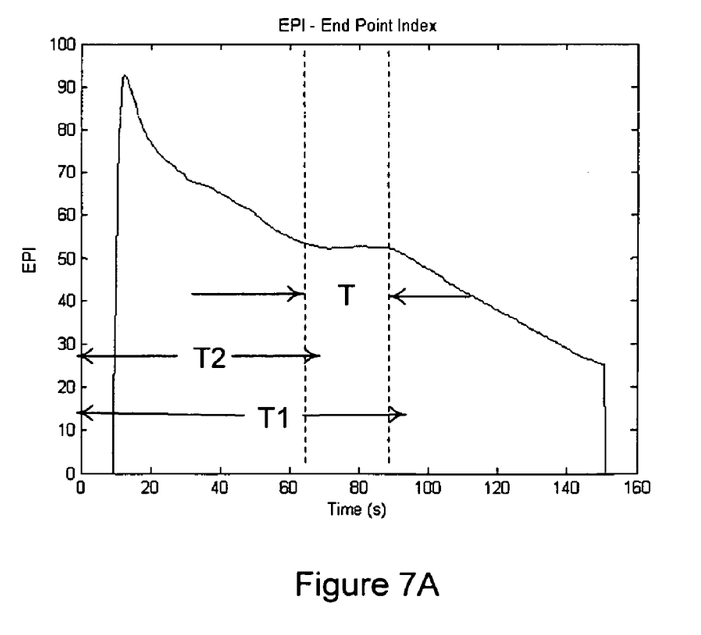

Accordingly, in another embodiment of the present invention, the recognition that the thermal effect can be approximated by an exponential function, allows most of the interfering thermal effect to be removed by fitting the RF voltage to an exponential function. During the extraction step utilizing this modeled thermal effect, the exponential function is subtracted from the original voltage signal, providing the signal shown in FIG. 7A. As can be seen in FIG. 7A, the signal associated with the endpoint of the etch process is now clearly visible.

An embodiment according to the present invention provides a system for fabricating semiconductor devices. In high volume manufacturing, consistently and reliably calling endpoint on dielectric etch process where the exposed area is less than 1% has been an elusive goal, with most fabrication facilities running inefficient and often costly fixed time approaches. The present method and system include a plasma etch end point technique designed to provide one end point solution that works across different dielectric etch processes (via, contact, BARC, trench) where the exposed areas start from less than about 0.5% to full coverage.

Embodiments in accordance to present invention combines non-intrusive in-situ RF sensors with selected software to achieve a real time highly accurate characterization of the wafer surface during processing, something largely immeasurable with today's technologies. Through this real-time capability, embodiments in accordance to present invention can readily determine the time at which complete clearing of distinct film substrates occurs and in real-time detect the end point. An embodiment in accordance to present invention may work across a number of dielectric mask levels, technology nodes, processes and film types with little to no customization required.

The production result may be a highly centered, repeatable and reliable dielectric etch process that improves device yield/bin sort characteristics, combats incoming film thickness variations, improves tool throughput and serves as an effective tool for real-time outlier identification and diagnosis.

Figure 8:
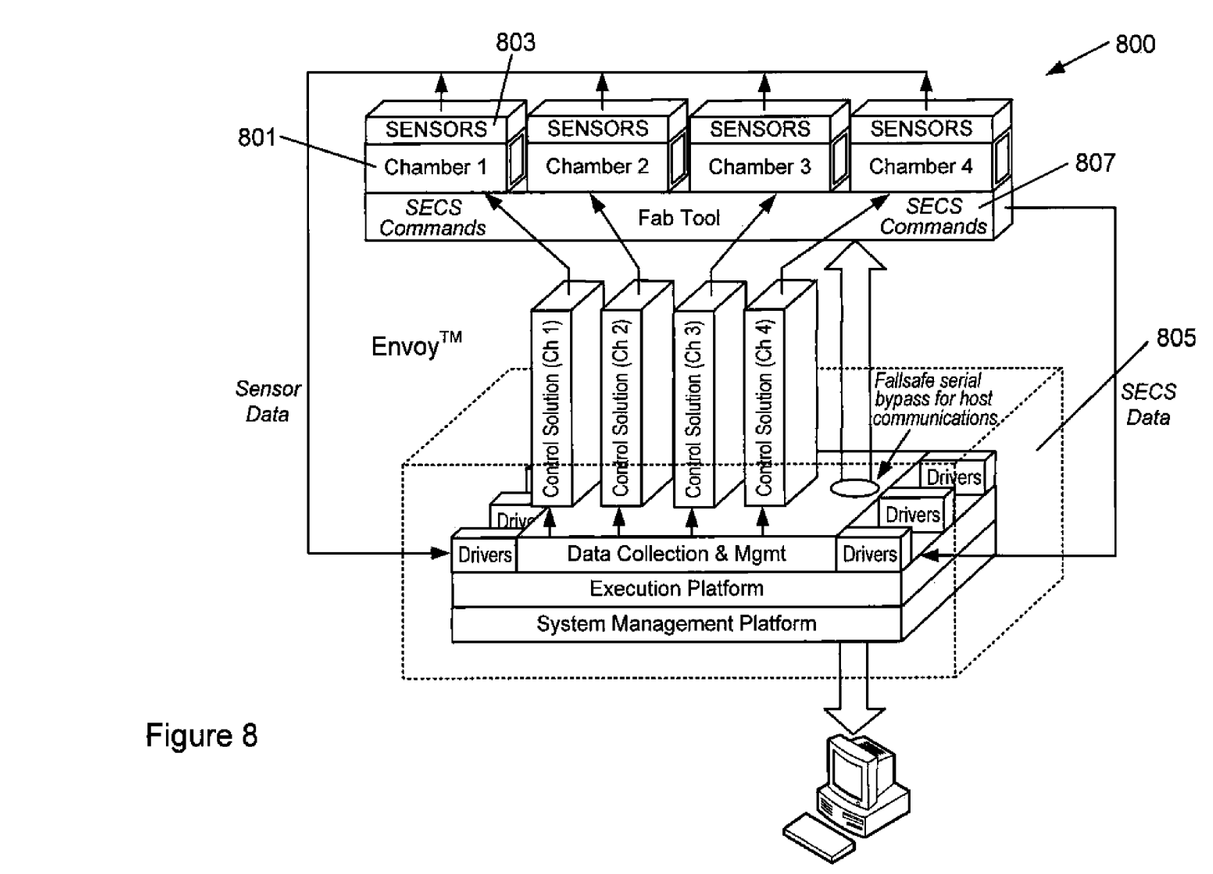
FIG. 8 is an exemplified diagram of a system for processing semiconductor devices according to an embodiment of the present invention.

FIG. 8 is an exemplified diagram of an embodiment of system 800 for in-situ monitoring processing one or more films of materials using an end-point detection process according to the present invention. The system provides an active end point control for a low exposed area (for example, less than 0.5%) dielectric etch process. As shown, the system includes one or more process chambers 801. Each of the process chambers includes one or more sensors 803 operably coupled to the chambers. The one or more sensors are configured to collect information associated with the plasma environment in the etch tool during a determined time period. The chamber maintains the plasma environment during the determined time period. The information is characterized by a first signal intensity. In certain embodiments, the sensor device is configured to collect information on the RF signal in the chamber, but can be others. This other information can include certain light intensity, temperature, pressure, or gas composition, among others.

The system also includes a process module 805 coupled to the sensor device in each of the process chamber. The process module includes elements such as control solutions, driver devices, computing devices and computer codes for data collection and management. The process module further includes an execution platform, and system management platform, among others. In a specific embodiment, the process module is configured to remove interfering signals associating with the etching process. The interfering signal may include those from thermal information, outgassing, magnetic interference, polymeric materials, among others.

As shown in FIG. 8, the system further includes an interface 807 to connect each of the process chambers to a database or a data storage present on a computer-readable storage medium. The interface may include communication standards such as a semiconductor equipment control system (SECS/GEM or SECS II/GEM or HSMS). The database can be part of the fabrication facility network and connect to other tools or computers. The computer readable storage medium may store the physical model that is utilized in extracting from the first signal, the second signal that is indicative of endpoint of the process. As shown, the signal intensity information, including the first signal intensity and the second signal intensity for each of the process chambers are uploaded to the database using the network interface. Of course there can be many other modification, variations, and alternatives.

FIG. 9A-10C are exemplified demonstrated results according to embodiments of the present invention.

Figure 9A:
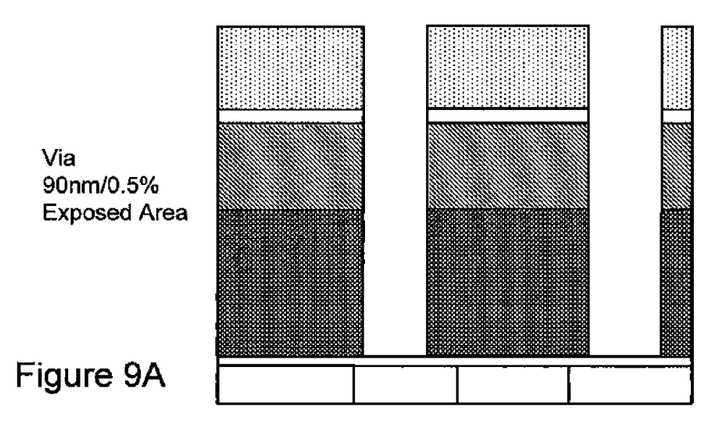
FIGS. 9A-9C are simplified diagrams illustrating a method for end point detection for an etch process according to an embodiment of the present invention.
Figure 9B:
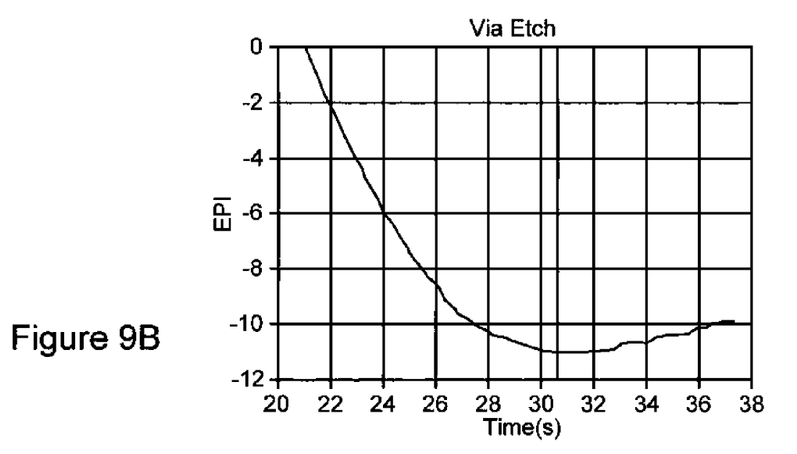
Figure 9C:
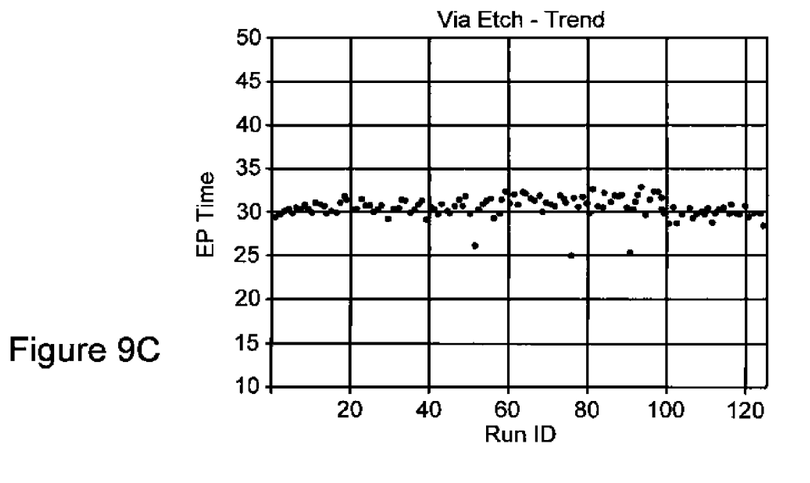

FIG. 9A shows an example of a 90 nm single damascene via structure with 0.5% exposed area according to an embodiment of the present invention. FIG. 9B is an example of a plot of end point index (EPI) signal indicating the end of the via etch "clearing" on the etch stop layer according to an embodiment of the present invention. FIG. 9C is an example of a trend of end point times over several hundred wafers with clear identification of outliers according to an embodiment of the present invention.

Figure 10A:
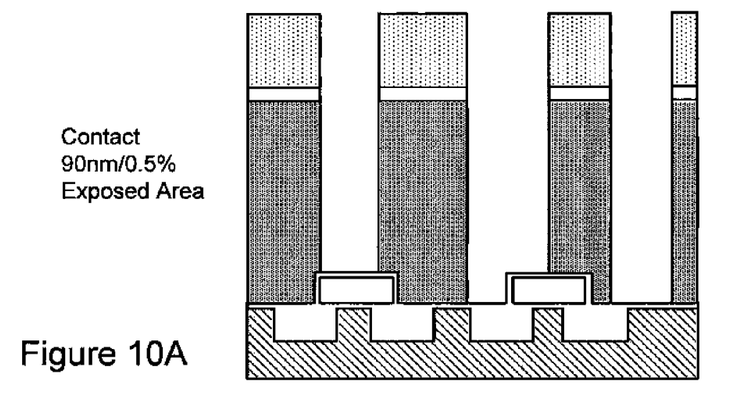
FIGS. 10A-10C are simplified diagrams illustrating a method for end point detection for an etch process according to an embodiment of the present invention.
Figure 10B:
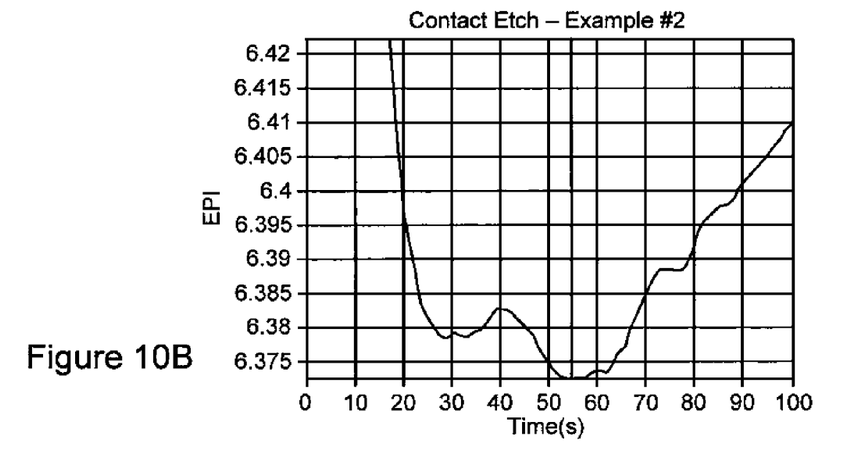
Figure 10C:
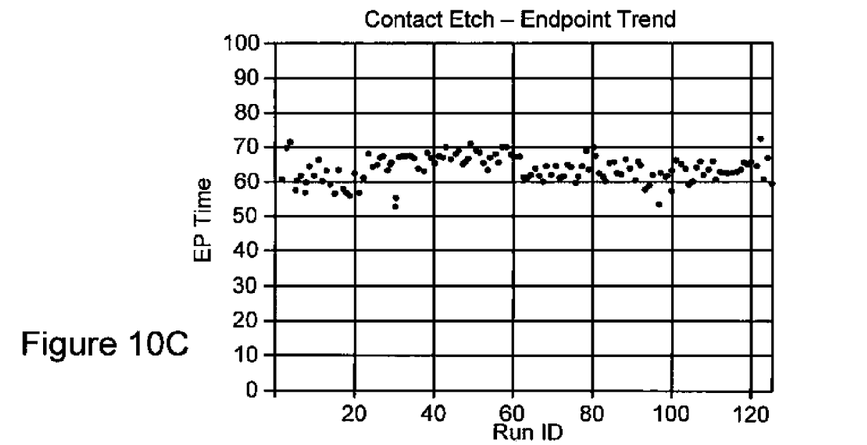

FIG. 10A shows an example of a 90 nm contact structure with 1.0% exposed area and two interfaces according to an embodiment of the present invention. FIG. 10B is an example of a plot of end point index (EPI) signal indicating the end of the contact etch "Clearing" on the etch stop layer according to an embodiment of the present invention. FIG. 10C is an example of a trend of end point times over several hundred wafers with clear identification of outliers according to an embodiment of the present invention.

Various embodiments according to the present invention may provide certain advantages such as a clear end point signal indicated by a robust, distinguishable, recognizable and consistent End Point Index (EPI) signal. Ease of use may be indicated by simple set-up, no complex algorithm to develop, and no special user training required. Other potential advantages offered by particular embodiments in accordance with the present invention may include versatility and therefore ideally suited for multiple dielectric etch processes across different exposed areas, nodes and film substrates with little to no configuration changes. Embodiments according to the present invention may also facilitate seamless tool integration as indicated by a seamless and transparent integration with a tool in any factory automation architecture. Moreover, certain embodiments in accordance with the present invention may provide powerful data analysis as indicated by analytic and visualization tools to quickly identify outliers, conduct excursion analysis and compare wafer-level data across multiple chambers. Of course there can be many variations, modification, and alternatives.

As shown, many benefits can be achieved by embodiments of the present invention. For example, embodiments of the present invention provide one end point solution for multiple processes, technology nodes, exposed areas, and film types. Embodiments according to the present invention may also provide an end point process window centering and control of incoming CVD and photo variations. In addition, embodiments in accordance with the present invention may provide an effective tool excursion and outlier control resulting in increased tool throughput. Embodiments of the present invention may also provide chamber matching of end point performance, as well as extension of current capital equipment to future technology nodes.

Although a number of specific embodiments are shown and described above, embodiments of the invention are not limited thereto. For example, it is understood that the material to be etched is not limited to dielectric material. Information other than RF signals (voltage, current, impedance, etc) and interfering signals other than magnetic field and thermal effect can be used without departing from the present invention. Moreover, the present invention is not limited to etch processes in a plasma environment. For example, embodiments in accordance to the present invention can be applied in end point detection for a deposition process, including but not limited to physical vapor deposition or plasma-enhanced chemical vapor deposition (PECVD), high density plasma chemical vapor deposition (HDP-CVD), and other forms of chemical vapor deposition, such as low pressure chemical vapor deposition (LP-CVD).

Moreover, embodiments in accordance with the present invention are not limited to identifying endpoint in processes utilized to fabricate semiconductor chips. In accordance with alternative embodiments, endpoint can be determined for processes utilized in the fabrication of flat panel displays, microelectromechanical structures (MEMS) and other devices.

It is also understood that the examples and embodiments described herein are for illustrative purposes only and that various modifications or changes in light thereof will be suggested to persons skilled in the art and are to be included within the spirit and purview of this application and scope of the appended claims

What is claimed is:

1. A method for processing a semiconductor device using an end-point detection process, the method comprising:
   providing a semiconductor wafer having a film to be processed;
   processing the film in a plasma environment during a determined time period;
   collecting information associated with the plasma environment during the determined time period, the information being characterized by a first signal intensity selected from an intensity of an RF signal, a light signal, a temperature signal, a pressure signal, a voltage signal, or a gas composition signal;
   extracting a change in signal intensity from the first signal intensity, the change in signal intensity having a second signal intensity;
   associating the change in signal intensity at the second intensity with an end point associated with the processing of the film in the plasma environment;
   whereupon the second signal intensity is about 0.25% or less of the first signal intensity.

2. The method of claim 1 wherein the extracting measures signals associated with one or more physical effects affecting with the first signal intensity.

3. The method of claim 1 wherein the extracting further removes signals associated with one or more physical effects affecting the first signal intensity.

4. The method of claim 2 wherein the extracting is based upon a mathematical model derived from one or more of the physical effects.

5. The method of claim 4 wherein the one or more physical effects comprise a phenomenon selected from at least one of a thermal effect, a magnetic interference effect, outgassing, and a polymeric material.

6. The method of claim 5 wherein the magnetic interference effect is measured using a Hall probe.

7. The method of claim 5 wherein the thermal effect is modeled using an exponential function.

8. The method of claim 1 wherein the second signal intensity is about 0.1% or less of the first signal intensity.

9. The method of claim 1 wherein the collecting comprises transferring one or more RF signals derived from one or more RF sensors coupled to one or more portions of an outer portion of a chamber maintaining the plasma environment.

10. The method of claim 1 wherein the collecting comprises transferring one or more optical signals derived from one or more sensors coupled to the plasma environment.

11. The method of claim 1 wherein the first signal intensity comprises a voltage applied to the plasma environment, a current flowing into the plasma environment, an impedance of the plasma environment, or a phase between voltage applied to the plasma environment and current flowing into the plasma environment.

12. The method of claim 11 wherein the first signal intensity is selected from a total voltage applied to the plasma environment, a total current flow to the plasma environment, a total impedance to the plasma environment, and a phase between the total voltage applied to the plasma environment and the total current flowing into the plasma environment.

13. The method of claim 1 wherein the first signal intensity comprises an optical emission intensity of one or more of the emission lines from the plasma environment.

14. The method of claim 1 further comprising storing the information associated with the plasma environment in a computer-readable storage medium.

15. The method of claim 1 wherein the processing is selected from a plasma etching process, a plasma-based deposition process, and a chemical mechanical polishing process.

16. The method of claim 1 wherein the film is overlying a stop layer.

17. The method of claim 1 wherein the film is overlying an active region, the active region being crystalline in form and having over etch region of about 200 Angstroms or less.

18. The method of claim 1 wherein the film is overlying a copper material.

19. The method of claim 1 wherein the change in signal intensity occurs during a second time period.

20. The method of claim 19 wherein the second time period is associated with a complete processing of the film.

21. A system for in-situ monitoring of the processing of one or more films of materials using an end-point detection process, the system comprising:
   a chamber, the chamber being adapted to maintain a plasma environment therein;
   a susceptor coupled to the chamber, the susceptor being adapted to hold a semiconductor wafer having a film to be processed;
   one or more sensors operably coupled to the chamber and adapted to collect information associated with the chamber environment during a determined time period, the information being characterized by a first signal intensity selected from an intensity of an RF signal, a light signal, a temperature signal, a pressure signal, a voltage signal, or a gas composition signal;
   a process module coupled to the one or more sensors, the process module being adapted to extract a change in signal intensity from the first signal intensity, the change in signal intensity having a second signal intensity, the process module being adapted to associate the change in signal intensity at the second intensity with an end point associated with the processing of the film in the chamber environment;
   whereupon the second signal intensity is about 0.25% or less of the first signal intensity.

22. The system of claim 21 wherein the second signal intensity is about 0.1% or less of the first signal intensity.

* * * * *